United States Patent [19]

Waters

[11] 4,423,390

[45] Dec. 27, 1983

[54] SIDE LOCK AVOIDANCE NETWORK FOR PSK DEMODULATOR

[75] Inventor: George W. Waters, Indialantic, Fla.

[73] Assignee: Harris Corporation, Melbourne, Fla.

[21] Appl. No.: 223,574

[22] Filed: Jan. 9, 1981

[51] Int. Cl.³ .............................................. H03L 7/12
[52] U.S. Cl. ......................................... 331/4; 331/11; 331/14; 331/DIG. 2
[58] Field of Search .................................... 331/10–12, 331/4, 14, DIG. 2; 329/50, 122, 124, 110; 375/120

[56] References Cited

U.S. PATENT DOCUMENTS

| | | | |
|---|---|---|---|
| 3,768,030 | 10/1973 | Brown et al. | 331/12 |
| 3,796,962 | 3/1974 | Hekimian | 331/11 X |
| 4,000,476 | 12/1976 | Walker et al. | 331/4 X |
| 4,077,016 | 2/1978 | Sanders et al. | 331/4 |

Primary Examiner—Siegried H. Grimm
Assistant Examiner—Tim A. Wiens
Attorney, Agent, or Firm—Antonelli, Terry & Wands

[57] ABSTRACT

A sidelock avoidance scheme for preventing sidelock in a PSK demodulator's carrier recovery loop contains augmenting sweep control circuitry, including a frequency discriminator and an associated window comparator. The output of the frequency discriminator, which is low pass filtered to remove noise, is applied to the window comparator which compares any differential between the true carrier and the output of a carrier recovery loop to a preset reference threshold representative of a frequency error condition that may approach sidelock. When the output of the frequency discriminator is greater that this preset reference threshold, an augmented frequency control voltage is applied to the voltage control oscillator of the loop to drive the oscillator away from a possible sidelock condition and toward the true carrier. The augmented frequency control voltage may be derived from a frequency sweep generator or from the output of the frequency discriminator, depending upon a selected strapping option.

18 Claims, 1 Drawing Figure

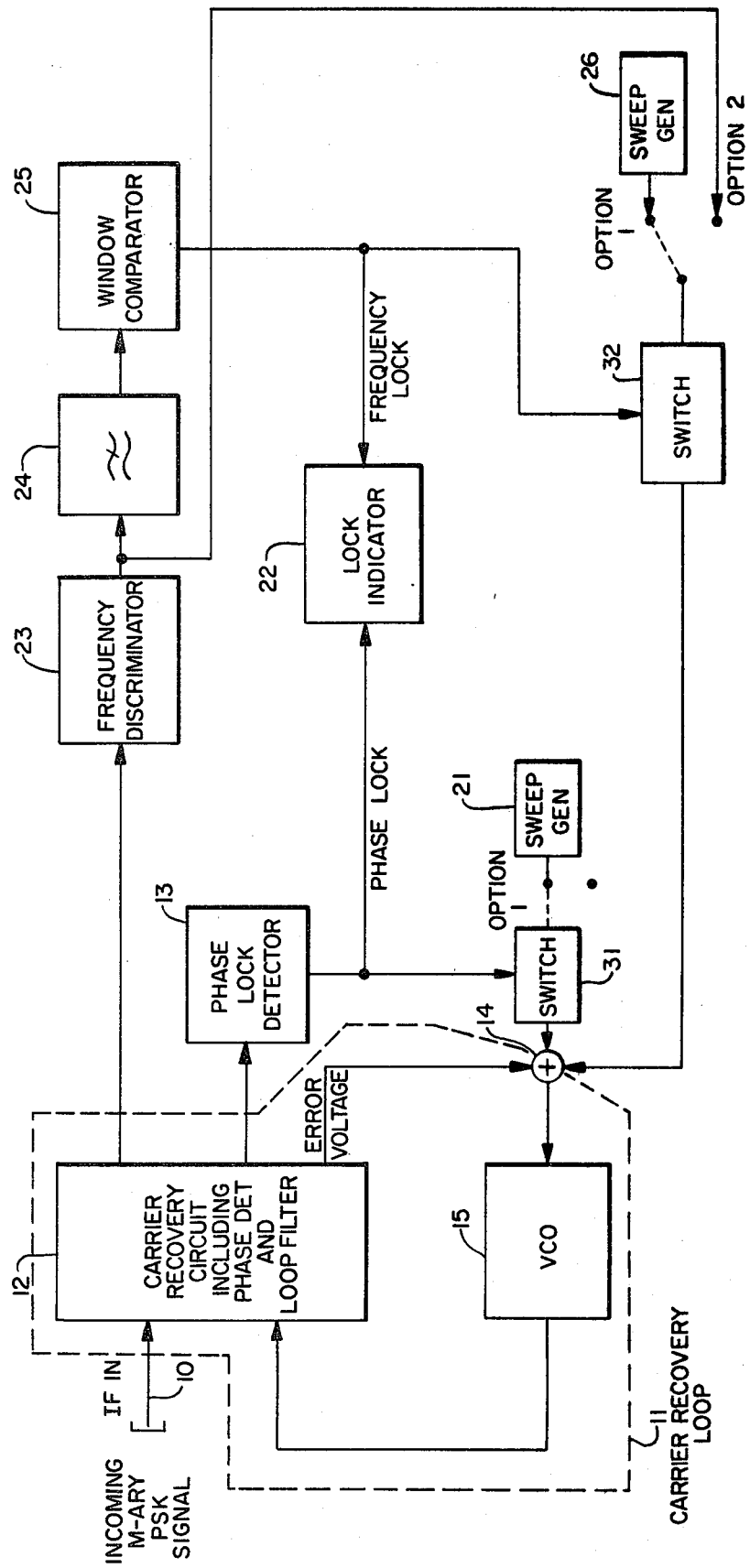

SIDE LOCK AVOIDANCE NETWORK FOR PSK DEMODULATOR

FIELD OF THE INVENTION

The present invention relates to demodulation circuits, especially coherent or synchronous demodulators, and is particularly directed to an improved phase lock loop scheme for PSK demodulator which prevents the loop from being side-locked to a sideband frequency of the desired lock frequency.

BACKGROUND OF THE INVENTION

In present-day communication systems, phase locked loops are often employed as part of the signal recovery scheme. Typically, a phase-locked loop may include a phase detector, a low pass filter and a voltage controlled oscillator. The controlled oscillator phase makes the signal recovery loop capable of locking onto or becoming synchronized with the carrier frequency of the incoming signal. As the phase between the carrier of the incoming signal and the output of the oscillator changes, indicating a change in carrier frequency in the incoming signal, the output of the phase detector changes proportionally, causing an adjustment of the oscillator output frequency to follow the change in the carrier frequency of the incoming signal and maintaining the signal recovery loop "locked" onto the carrier frequency of the incoming signal.

Unfortunately, because of the recovery mechanism inherent in its operation, the phase locked loop is susceptible to becoming stable in an anamolous locking mode in which the loop is locked onto a frequency other than the true carrier. In this condition, termed "sidelock," since the output frequency of the voltage controlled oscillator does not correspond to the carrier frequency of the incoming signal, demodulation of the incoming signal cannot be effected. This problem becomes especially severe in communication systems that employ PSK modulation techniques.

In a conventional signal recovery arrangement, the carrier may be recreated, for example, by first multiplying the received signal by a frequency multiplier corresponding to the number (M) of phases employed for the modulation of the (M-ary) PSK signal. The resulting signal is then coupled to a phase-locked loop, the voltage controlled oscillator of which produces a frequency M times the carrier $f_c$. The output of the phase-locked loop is then equal of $Mf_c$ which, after division by M, can be employed for synchronous detection, i.e. signal recovery. Unfortunately, because of the characteristics of the input signal a plurality of sidebands spaced about either the carrier or another sideband by the modulation rate M of the PSK signal are produced. If the modulation rate is relatively small, e.g. binary or quaternary, compared to the frequency uncertainty of the received carrier, it may be effectively impossible to prevent sidelock. Namely, for binary PSK, false locks occur at one-half the symbol rate; for quaternary PSK, the false locks occur at one-fourth the symbol rate.

One proposal to circumvent this problem is described in the U.S. Pat. Nos. to Walker et al. 4,000,476 and Sanders et al. 4,077,016. Briefly, each patent describes a scheme wherein the conventional carrier recovery loop, including a lock detector, is provided with a sidelock or false lock detector which is tuned to a sideband of the true carrier center frequency $f_c$. This sidelock detector cooperates with the conventional phase-locked loop to detect a sidelock condition and energize a lock inhibit circuit. The lock inhibit circuit prevents the phase-locked loop from remaining in the locked condition by activating or enabling a sweep generator to drive the reference oscillator away from the false lock sideband and hopefully toward the true carrier $f_c$ to be acquired. However, if a sidelock condition is again detected, the oscillator is again driven out of its locked condition; namely, the process is repeated until the voltage controlled oscillator is finally driven to the desired lock condition.

The schemes described in the above referenced patents are typically used in communication schemes where there is little filtering in the transmission path or which do not have a wide acquisition range. In satellite communication links, however, neither of these conditions is usually satisfied, so that the sidelock avoidance schemes described above are not effective.

More specifically, for narrowly filtered transmissions, the false lock condition can be as strong as true lock. Under this circumstance, what would normally be a fairly limited error voltage at the output of the phase locked loop becomes a very strong voltage, which effectively neutralizes the sweep voltage. Namely, as the sweep voltage generator is attempting to drive the voltage controlled oscillator away from the sideband in response to the output of the sidelock detector, the strong error voltage output of the phase locked loop is counteracting this action by driving it back toward the sidelock frequency. As a result, the loop is unable to extricate itself from the sidelock condition, so that signal recovery cannot be effected.

Another factor which makes the schemes described in the above-referenced literature unacceptable for satellite communication networks is the close channel spacing encountered coupled with a relatively wide acquisition range. Typically, a satellite communication network contains a large number of channels located close to one another in the frequency domain. In this type of communication environment, a scheme such as proposed by the patent to Sanders et al, for example, is ineffective, because the PSK modems for adjacent channels would interfere with the action of the false lock detector. Namely, the circuit which measures the energy at fixed frequency increments above and below the lock frequency (preferably twice the bit clock frequency) would also be acted on by closely spaced adjacent channels. For example, with the phase lock loop at true lock, a large amplitude adjacent channel could activate the false lock indicator and drive the loop away from true lock.

SUMMARY OF THE INVENTION

In accordance with the present invention, there is provided a new and improved circuitry configuration for preventing or avoiding sidelock in a PSK demodulator that is particularly useful in a communication system, such as a satellite communication system, wherein narrow filtered transmissions, close channel spacing, and a relatively wide acquisition range are encountered. The normal carrier recovery loop is coupled to a phase lock detector which monitors the output of the carrier recovery loop and produces a phase lock indication signal when phase lock between the output of the voltage controlled oscillator and the incoming signal occurs. The output of the phase lock detector may also be employed to control the selective coupling of a phase lock sweep generator to the voltage controlled oscillator for the purpose of providing rapid phase lock acquisition.

Pursuant to the sidelock avoidance scheme offered by the present invention, the above described carrier recovery loop arrangement is augmented by additional sweep control circuitry, including a frequency discriminator and an associated window comparator. The ouput of the frequency discriminator, which is low pass filtered to remove noise, is applied to the window comparator which compares any differential between the true carrier frequency and the instantaneous frequency of the carrier recovery loop to a preset reference threshold representative of frequency error condition that may approach sidelock. When the output of the frequency discriminator is greater than this preset reference threshold, an augmented frequency control voltage is applied to the voltage control oscillator to drive the oscillator away from a possible sidelock condition and toward the true carrier.

In accordance with a first option of the present invention, which is employed where the output of the phase lock detector selectively couples the phase lock sweep generator to the voltage controlled oscillator an additional sweep is also selectively connected to the voltage controlled oscillator, causing an increased sweep rate of the voltage controlled oscillator when an excess frequency error (as determined by the window comparator) is present. This increased sweep rate is switched off when the loop nears lock. As a second option, where no sweep generator is employed, the frequency error output from the discriminator itself is employed as the sweep voltage, causing the loop to sweep towards lock. Upon the loop acquiring lock, the frequency error signal may be switched out to avoid added noise in the carrier loop.

By virtue of the use of the frequency discriminator as the augmenting control circuitry for the phase locked loop, a very strong sweep voltage is applied to the voltage controlled oscillator, so that, unlike the schemes of the patent literature discussed above, the sweep control voltage is capable of overriding the error voltage of the loop. In effect, the sidelock avoidance sweep undergoes a vernier type of control. For the first option, where the output of the frequency discriminator indicates that the loop is attempting to acquire signal far away from the true carrier, the augmenting sweep generator voltage rapidly drives the voltage controlled oscillator toward the locked condition. When the window comparator detects that the incoming signal is getting close to lock, it disables the rapid sweep and thereafter allows the phase lock sweep generator to more slowly and precisely sweep the voltage controlled oscillator until the loop is in the locked condition. For the second option, using the output of the frequency discriminator itself as the augmenting control voltage, the sweep is fast when the incoming signal is far away from the true carrier, and gradually decreases as the incoming signal approaches lock. In either case, the augmenting control voltage is sufficiently large to override the strong loop error voltage for a not true-lock condition, so that sidelock can be avoided. As the loop oscillator output voltage approaches lock, i.e. is not near sidelock, the loop is permitted to operate in a normal manner as it acquires lock.

BRIEF DESCRIPTION OF THE DRAWINGS

The single FIGURE is a schematic block diagram of a phase-locked loop employing the false lock avoidance circuitry in accordance with the present invention.

DETAILED DESCRIPTION

Referring now to the single FIGURE of the drawings, a schematic block diagram of the improved false locked avoidance network configuration in accordance with the present invention is illustrated. It should be noted that a detailed illustration of the individual components circuitry shown in the FIGURE has not been presented, since the make-up of such components themselves is conventional and is not considered a requisite for an understanding of the present invention. The configuration shown in the FIGURE includes the basic carrier recovery components of a standard phase lock loop, together with the sidelock detector/correction circuitry employing the frequency discriminator control components in accordance with the present invention to be described below.

An incoming M-ary PSK signal to be acquired and the signal contents of which are to be recovered (by separate signal recovery circuitry not shown) is coupled over line 10 to a carrier recovery circuit 12 which forms part of a conventional carrier recovery loop 11. Carrier recovery circuit 12 includes the conventional phase detectors and loop filter, the output of which is coupled as an error voltage to drive voltage controlled oscillator (VCO) 15 within the carrier recovery loop 11. The error voltage is coupled as an input to an adder 14, the output of which is coupled to the drive input of the VCO 15. The output of VCO 15 is coupled to the carrier recovery circuit 12. The output of the carrier recovery circuit 12 is also coupled to a phase lock loop detector 13. Phase lock detector 13 is coupled to a lock indicator 22 which is energized upon the output of phase lock detector 13 indicating that a phase lock condition has been achieved.

As described briefly above, the output of phase lock detector 13 may also be coupled to control the opening and closing of a switch 31. Switch 31 couples the output of a sweep generator 21 to one input of summing or adder circuit 14 under the control of the output of phase lock detector 13. If phase lock has not been achieved, the output of phase lock detector 13 causes switch 31 to couple the output of a sweep generator 21 to adder circuit 14 so that VCO 15 sweeps its frequency in accordance with the output of the sweep generator 21. The output of sweep generator 21 together with the error voltage from the carrier recovery loop 12 are summed in adder 14 to supply the control voltage for the voltage controlled oscillator 15 for acquiring phase lock.

As was described briefly above, in conjunction with the description of conventional PSK phase lock loops, this type of carrier acquisition circuity, without any augmenting sidelock avoidance scheme suffers in that it is susceptible to sidelock. Namely, phase lock detector 13 may detect a locked condition if the carrier recovery loop acquires a strong sideband rather than the true carrier. Under such conditions, the sweep generator 21 would be deenergized and the error voltage output of the carrier recovery loop would be strong enough to maintain the loop in a condition locked into the sideband.

To circumvent this problem, the present invention supplies an augmenting sidelock avoidance circuit comprised of a frequency discriminator/sweep generator in addition to the carrier recovery loop described above. Specifically, the output of carrier recovery circuit 12 is also coupled to a frequency discriminator 23. Frequency discriminator 23 may be any one of a number of conventionally employed frequency discriminators, such as those employing Costas loops. For a disclosure of such a frequency discriminator, attention may be directed to U.S. Pat. Nos. 3,800,231; 3,748,590; and 3,160,815, as well as British Pat. Nos. 1,363,396 and 1,530,602.

The output of frequency discriminator 23 is a frequency error representative voltage that is coupled through a low pass filter 24 to a window comparator 25. Window comparator 25 is configured of a threshold detector, the magnitude of the threshold of which is set at a prescribed value determined in accordance with the spacing encountered sidebands relative to the true carrier. The output of window comparator 25 is coupled as a control signal for a switch 32. It is also coupled to lock indicator 22 for the purpose of providing an indication that the true carrier frequency has been acquired. The input to switch 32 is derived either from a sweep generator 26 or from the output of the frequency discriminator 23 depending upon which of a pair of options is strapped into the circuit. The output of switch 32 is coupled as a third input to adder 14 for driving voltage controlled oscillator 15. Sweep generator 26, like sweep generator 21, may comprise a sawtooth generator, the magnitude and frequency of which is different from sweep generator 21, so as to provide an auxiliary driving voltage of the voltage controlled oscillator 15. In order to better understand the manner in which sweep generator 26 and the output of frequency discriminator 23 function to avoid sidelock, consider the two strapping options that may be employed.

In accordance with the first option, the output of sweep generator 21 is coupled to the input of switch 31, as shown, and the output of sweep generator 26 is coupled to the input of switch 32, as shown. Under these conditions, if the frequency of the incoming signal is not close to the desired lock condition, but is near a sideband or far away from the carrier by a prescribed minimum frequency spacing, the output of frequency discriminator 23 will provide an error voltage in excess of the threshold with which comparator 25 compares the output of low pass filter 24. Under these circumstances, the output of threshold detector 25 closes switch 32, causing the output of sweep generator 26 to be coupled to adder 14. The magnitude of the output of sweep generator 26 is sufficiently large to override the error voltage from the carrier recovery circuit 12 and to drive the output of the voltage controlled oscillator 15 towards the true lock condition. As the frequency separation between the incoming signal and the desired true lock carrier decreases, the output of frequency discriminator 23 correspondingly decreases. Eventually, during the sweep of generator 26 and the decrease in the differential output of frequency discriminator 23, the magnitude of the output of frequency discriminator 23 drops below the threshold set for window comparator 25. At this time, switch 32 is opened and the output of sweep generator 26 is no longer coupled as an auxiliary or augmenting voltage control to adder 14 and voltage controlled oscillator 15 connected thereto. Namely, sweep generator 26 operates to steer or drive the control voltage of the phase lock loop toward true carrier. When the frequency difference gets close enough to true carrier, and the sweep generator 26 is disconnected as an auxiliary drive input to adder 14, the carrier recovery loop operates in its normal manner. As long as phase lock has not been acquired, phase lock detector 13 continues to enable switch 31 to couple the sweep generator 21 to adder 14 and drive the output of voltage controlled oscillator 15 until phase lock is acquired. Once phase lock is acquired, phase lock detector 13 disables or opens switch 31 and a dual lock condition, namely both frequency lock and phase lock, are indicated. In other words, as long as the output of frequency discriminator 23 is less than the threshold set by window comparator 25, lock indicator 22 indicates that there is a true carrier lock condition. Once phase lock for this true carrier condition has been acquired, a further lock indication is provided by phase lock detector 13.

In accordance with a second option provided in accordance with the present invention, the output of the frequency discriminator 23 is employed as the augmenting voltage for the voltage controlled oscillator 15. In this circumstance, neither sweep generator 21 nor sweep generator 26 is employed. If the incoming signal is either close to or at a sideband frequency, namely the system is certainly out of lock, the magnitude of the output voltage of frequency discriminator 23 will cause window comparator 25 to trigger and enable switch 32. The output of frequency discriminator 23 is a large magnitude voltage which is coupled as the auxiliary drive voltage to adder 14 and voltage controlled oscillator 15. In other words, the frequency discriminator itself acts in place of the sweep voltage provided by generators 26 and 21. For large frequency differentials, a large control voltage is supplied to the voltage controlled oscillator 15 to drive the oscillator towards true carrier. As the frequency differential decreases, the output voltage of frequency discriminator 23 decreases accordingly, whereby the sweep or drive for the voltage controlled oscillator 15 correspondingly decreases. In other words, the system operates in a vernier mode as the output of oscillator 15 closes in on true carrier. Upon the frequency differential being less than the threshold set by window comparator 25, switch 32 is opened and the error voltage of the carrier recovery circuit 12 is employed for purposes of acquiring the phase lock. Again, once phase lock has been achieved, lock detector 13 supplies an indication to lock indicator 22.

As will be appreciated from the foregoing description of the present invention, the problem of sidelock in a PSK demodulator can be circumvented by a frequency discriminator control scheme that is particularly useful where closely spaced, narrow filtered transmissions and a wide acquisition range are encountered. Because the augmenting control circuitry provides an output indicative of the magnitude of the frequency error, rather than just observing that sidelock has occurred, it is capable of supplying a sufficiently strong control voltage to override the error voltage that would otherwise drive the loop oscillator and prevent the loop from escaping sidelock.

While I have shown and described several embodiments in accordance with the present invention, it is understood that the same is not limited thereto but is susceptible of numerous changes and modifications as are known to a person skilled in the art, and I therefore do not wish to be limited to the details shown and described herein but intend to cover all such changes and modifications as are obvious to one of ordinary skill in the art.

What is claimed:

1. An apparatus for preventing a phase-lock loop, including a phase detector and a voltage controlled oscillator, from achieving sidelock, in response to an input signal including components at a desired lock frequency and a sideband component separated from said desired lock frequency, said loop further including a lock detector coupled to the output of said phase detector, and a sweep voltage generator, the output of said sweep voltage generator being selectively coupled to said voltage controlled oscillator in accordance with the output of said lock detector, comprising:

first means, coupled to the output of said phase detector, for generating an error voltage representative of the degree of separation of the output of said phase detector and a voltage representative of said desired lock frequency; and second means, responsive to said error voltage, for coupling a voltage, the magnitude of which varies with time and is exclusive of said sweep voltage generator, as an auxiliary control voltage to said voltage controlled oscillator.

2. An apparatus according to claim 1, wherein said second means includes means for comparing said error voltage with a prescribed reference value and coupling said auxiliary control voltage to said voltage controlled oscillator in response to said error voltage exceeding said prescribed reference value.

3. For use with a carrier recovery phase-locked loop wherein an incoming signal, the carrier frequency of which is to be acquired, is coupled to a phase detector the output of which is coupled to drive a voltage controlled oscillator for supplying a reference frequency for said phase detector, a false lock avoidance network comprising:

a frequency discriminator the input of which is coupled to the output of said phase detector for generating an output representative of the difference between the true carrier frequency and the instantaneous frequency provided at the output of said phase detector; and means for selectively coupling the output of said frequency discriminator as an auxiliary control voltage to said voltage controlled oscillator in dependence upon the output of said frequency discriminator.

4. A false lock avoidance network according to claim 3, wherein said selectively coupling means comprises means for coupling the output of said frequency discriminator as an auxiliary control voltage to said voltage controlled oscillator in response to the output of said frequency discriminator exceeding a preselected reference voltage, but decoupling the control voltage input of said voltage controlled oscillator from the output of said frequency discriminator in response to the output of said frequency discriminator not exceeding said preselected reference voltage.

5. For use with a carrier recovery phase-locked loop wherein an incoming signal, the carrier frequency of which is to be acquired, is coupled to a phase detector the output of which is coupled to drive a voltage controlled oscillator for supplying a reference frequency for said phase detector and including a lock detector coupled to the output of said phase detector, and a sweep voltage generator the output of which is selectively coupled to said voltage controlled oscillator in accordance with the output of said lock detector, a false lock avoidance network comprising:

first means, coupled to the output of said phase detector, for generating an error voltage representative of the degree of separation of the output of said phase detector and a voltage representative of said carrier frequency; and second means, responsive to said error voltage, for coupling an auxiliary voltage, exclusive of said sweep voltage generator, to said voltage controlled oscillator as an auxiliary control voltage therefor.

6. A false lock avoidance network according to claim 5, wherein said second means includes means for selectively coupling said auxiliary voltage to said voltage controlled oscillator in dependence upon the magnitude of said error voltage.

7. A false lock avoidance network according to claim 6, wherein said second means includes means for coupling said auxiliary voltage to said voltage controlled oscillator in response to the magnitude of said error voltage exceeding a preselected reference voltage, but decoupling the control voltage input of said voltage controlled oscillator from said auxiliary voltage in response to the magnitude of said error voltage not exceeding said preselected reference voltage.

8. A false lock avoidance network according to claim 5, wherein said second means includes means for coupling an auxiliary sweep voltage to said voltage controlled oscillator as said auxiliary control voltage therefor.

9. A false lock avoidance network according to claim 8, wherein said second means includes means for selectively coupling said auxiliary sweep voltage to said voltage controlled oscillator in dependence upon the magnitude of said error voltage.

10. A false lock avoidance network according to claim 9, wherein said second means includes means for coupling said auxiliary sweep voltage to said voltage controlled oscillator in response to the magnitude of said error voltage exceeding a preselected reference voltage, but decoupling the control voltage input of said voltage controlled oscillator from said auxiliary sweep voltage in response to the magnitude of said error voltage not exceeding said preselected reference voltage.

11. For use in a carrier recovery phase-locked loop wherein an incoming signal, the carrier frequency of which is to be acquired, is coupled to a phase detector the output of which is coupled to drive a voltage controlled oscillator for supplying a reference frequency for said phase detector, a method of preventing said loop from locking onto a side frequency other than said carrier frequency comprising the steps of:

(a) generating a voltage representative of the difference between the true carrier frequency and the instantaneous frequency provided at the output of said phase detector; and (b) selectively coupling said voltage generated in step (a) as an auxiliary control voltage to said voltage controlled oscillator in dependence on a characteristic of said voltage.

12. A method according to claim 11, wherein step (b) comprises coupling said voltage generated in step (a) as an auxiliary control voltage to said voltage controlled oscillator in response to the magnitude of said voltage exceeding a preselected reference voltage, but decoupling the control voltage input of said voltage controlled oscillator from said voltage in response to the magnitude of said voltage not exceeding said preselected reference voltage.

13. For use in a carrier recovery phase-locked loop wherein an incoming signal, the carrier frequency of which is to be acquired, is coupled to a phase detector the output of which is coupled to drive a voltage controlled oscillator for supplying a reference frequency for said phase detector and including a lock detector coupled to the output of said phase detector, and a sweep voltage generator the output of which is selectively coupled to said voltage controlled oscillator in accordance with the output of said lock detector, a method of preventing said loop from locking onto a side frequency other than said carrier frequency comprising the steps of:
(a) generating an error voltage representative of the degree of separation of the output of said phase detector and a voltage representative of said carrier frequency; and
(b) in response to said error voltage, coupling an auxiliary voltage, exclusive of said sweep voltage generator, to said voltage controlled oscillator as an auxiliary control voltage therefor.

14. A method according to claim 13, wherein step (b) comprises selectively coupling said auxiliary voltage to said voltage controlled in dependence upon the magnitude of said error voltage.

15. A method according to claim 14, wherein step (b) comprises coupling said auxiliary voltage to said voltage controlled oscillator in response to the magnitude of said error voltage exceeding a preselected reference voltage, but decoupling the control voltage input of said voltage controlled oscillator from said auxiliary voltage in response to the magnitude of said error voltage not exceeding said preselected reference voltage.

16. A method according to claim 13, wherein step (b) comprises coupling an auxiliary sweep voltage to said voltage controlled oscillator as said auxiliary control voltage therefor.

17. A method according to claim 16, wherein step (b) comprises coupling an auxiliary sweep voltage to said voltage controlled oscillator in dependence upon the magnitude of said error voltage.

18. A method according to claim 17, wherein step (b) comprises coupling said auxiliary sweep voltage to said voltage controlled oscillator in response to the magnitude of said error voltage exceeding a preselected reference voltage, but decoupling the control voltage input of said voltage controlled oscillator from said auxiliary sweep voltage in response to the magnitude of said error voltage not exceeding said preselected reference voltage.

* * * * *